United States Patent [19]

Koyanagi et al.

[11] Patent Number: 5,057,704

[45] Date of Patent: Oct. 15, 1991

[54] SEMICONDUCTOR INTEGRATED CIRCUIT HAVING SUBSTRATE POTENTIAL DETECTING CIRCUIT COMMONLY USED

[75] Inventors: Masaru Koyanagi, Tokyo; Minoru Yamada, Kawasaki, both of Japan

[73] Assignee: Kabushiki Kaisha Toshiba, Kawasaki, Japan

[21] Appl. No.: 496,961

[22] Filed: Mar. 21, 1990

[30] Foreign Application Priority Data

Mar. 22, 1989 [JP] Japan .................................... 1-69826

[51] Int. Cl.$^5$ ........................ H03L 1/00; H03K 3/354

[52] U.S. Cl. .............................. 307/296.2; 307/296.1; 307/304

[58] Field of Search ............... 307/296.1, 296.2, 296.8, 307/304

[56] References Cited

U.S. PATENT DOCUMENTS

| | | | |
|---|---|---|---|
| 4,322,679 | 3/1982 | Lee et al. | 307/296.2 X |
| 4,439,692 | 3/1984 | Beekmans et al. | 307/296.2 |
| 4,705,966 | 11/1987 | Van Zanten | 307/296.2 X |
| 4,794,278 | 12/1988 | Vajdic | 307/296.2 |
| 4,961,007 | 10/1990 | Kumanoya et al. | 307/296.2 |

FOREIGN PATENT DOCUMENTS

| | | |
|---|---|---|
| 0217065 | 4/1987 | European Pat. Off. . |
| 0262357 | 4/1988 | European Pat. Off. . |
| 0293045 | 11/1988 | European Pat. Off. . |
| WO84/03185 | 8/1984 | PCT Int'l Appl. . |

OTHER PUBLICATIONS

Nakano et al., "Effect of $V_{BB}$ Leak Path Circuit in Dynamic RAM Upon V-Bump Characteristic," 1983, National Meeting 555, Institute of Electronics and Communications Engineers of Japan.

*Primary Examiner*—Stanley D. Miller
*Assistant Examiner*—David R. Bertelson
*Attorney, Agent, or Firm*—Finnegan, Henderson, Farabow, Garrett, and Dunner

[57] ABSTRACT

A semiconductor integrated circuit for controlling the substrate potential is disclosed, in which a substrate potential generating circuit is connected to a substrate and can be operated on at least a certain operation voltage level to generate the substrate potential. A detection circuit outputs a first detection signal upon detecting that the substrate potential has become lower than the operation voltage level by more than a preset amount, and outputs a second signal upon detecting that the substrate potential has reached a preset level which is slightly lower than the operation voltage level. A charging circuit charges the substrate upon receiving the first detection signal and interrupts the operation of charging the substrate upon receiving the second detection signal.

24 Claims, 9 Drawing Sheets

SEMICONDUCTOR INTEGRATED CIRCUIT HAVING SUBSTRATE POTENTIAL DETECTING CIRCUIT COMMONLY USED

BACKGROUND OF THE INVENTION

1. Field of the Invention

This invention relates to a semiconductor integrated circuit, and more particularly to a substrate potential controlling circuit used in a semiconductor integrated circuit.

2. Description of the Related Art

A semiconductor integrated circuit generally includes a substrate potential controlling circuit for reducing current consumption caused by operation of a substrate potential generating circuit itself.

In general, such a substrate potential controlling circuit includes a substrate potential generating circuit for generating a substrate potential, a substrate potential detecting circuit for detecting the substrate potential, and a switching circuit for ON-OFF controlling the operation of the substrate potential generating circuit according to the output of the substrate potential detecting circuit. With the substrate potential controlling circuit, when the substrate potential is lowered and reaches a preset level, the substrate potential detecting circuit detects that the substrate potential is set to the preset value and supplies a detection output to the switching circuit. The switching circuit interrupts the operation of the substrate potential generating circuit in response to the detection output. In this way, the substrate potential generating circuit will not consume any current if the substrate potential is set below the threshold value of the substrate potential detection circuit. The substrate potential controlling circuit can keep the substrate potential at a constant level without increasing the current consumption by use of the above feedback loop.

The above substrate potential controlling circuit has a defect that the substrate potential cannot be controlled at a sufficiently high speed in response to variations in the power source voltage. Therefore, a substrate potential controlling circuit which can control the substrate potential irrespective of variations in the power source voltage has been developed. Such a circuit is disclosed in U.S. Pat. No. 4,794,278 (Inventor: Branislav, Vajdic, Applicant: Intel Corporation, Patented Date: Dec. 27th, 1988). The substrate potential controlling circuit disclosed in the above U.S. Patent includes first and second level detectors. The first level detector detects a substrate voltage less negative than a preset value. At this time, it supplies charges by use of the charge pump to force the substrate to a more negative voltage level. When the substrate voltage exceeds the threshold value, the charge supply is interrupted. The second level detector becomes operative when the substrate voltage has exceeded a preset limit level which lies on the negative side with respect to the threshold value. At this time, a clamper is operated to clamp the substrate voltage.

However, if the second detector is provided as described above, the total power consumption is increased by the power consumption of the second detector and therefore it is impossible to use the second detector in a device which requires a low power consumption. Further, since the detection circuit is separately disposed, the substrate potential may not be precisely controlled if the characteristics of detection elements are not constant.

SUMMARY OF THE INVENTION

Accordingly, an object of this invention is to provide a semiconductor integrated circuit which has a common substrate potential detection circuit and has an improved ability of the substrate potential to follow variations in the power source voltage without increasing the power consumption.

In order to attain the above object, a semiconductor integrated circuit of this invention comprises means for generating a substrate potential, connected to a substrate and set operative on at least a certain operation voltage level; detection means for outputting a first detection signal upon detecting that the substrate potential generated by the substrate potential generating circuit has become lower than the operation voltage level by more than a preset amount, and outputting a second detection signal upon detecting that the substrate potential has reached a preset level which is set slightly lower than the operation voltage level; and means connected to the detection means, for charging the substrate upon receiving the first detection signal, and interrupting the charging operation upon receiving the second detection signal.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
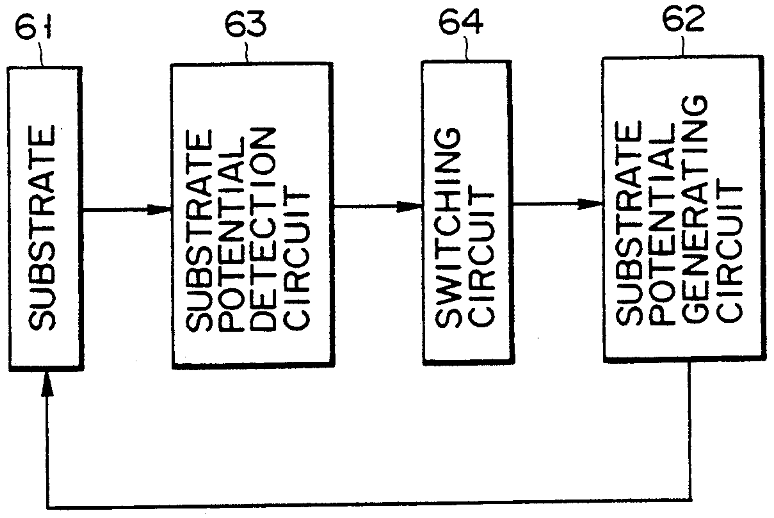
FIG. 1 is a diagram showing the general circuit construction of a substrate potential controlling circuit.

As is schematically shown in FIG. 1, a substrate potential controlling circuit includes a substrate potential generating circuit 62 for generating a potential of a substrate 61, a substrate potential detection circuit 63 for detecting the potential of the substrate 61, and a switching circuit 64 for ON-OFF controlling the operation of the substrate potential generating circuit 62 according to the output of the substrate potential detection circuit 63.

With this substrate potential controlling circuit, when the substrate potential is lowered and reaches a preset value, the substrate potential detecting circuit 63 is made operative and the switching circuit 64 interrupts the operation of the substrate potential generating circuit 62 so that the substrate potential generating circuit 63 itself will not consume any current until the substrate potential exceeds the threshold value of the substrate potential detection circuit 63.

Figure 2:
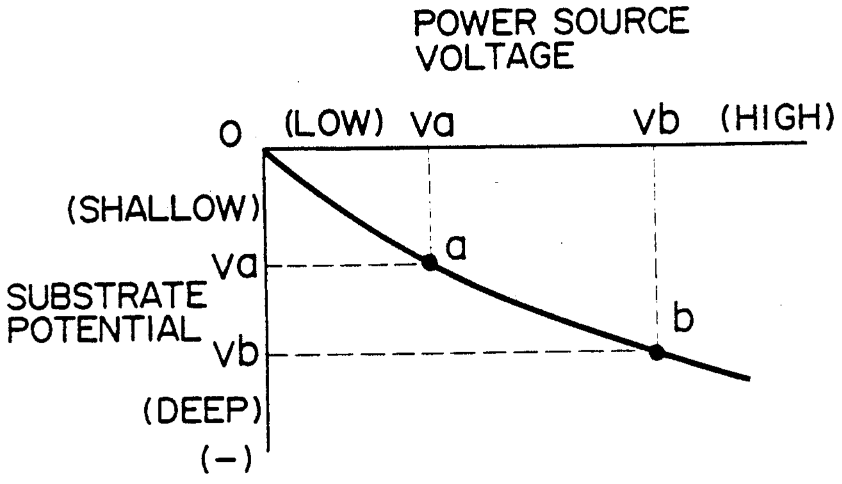
FIG. 2 is a diagram showing the dependency of the substrate potential on the power source voltage in the circuit of FIG. 1.

Also, even in a case where the operation of the circuit arranged on a chip of the semiconductor integrated circuit is frequently effected so as to permit a large amount of substrate current flow or in a case where the operation of the circuit inside the chip is not frequently effected so as to permit only a small amount of substrate current flow, the substrate potential can be kept at a constant value by the operation of the substrate potential detection circuit 63. With the above substrate potential controlling circuit, the dependency of the substrate potential on the Vcc power source voltage as shown in FIG. 2 can be obtained. That is, the substrate potential generally becomes negatively deeper as the Vcc power source voltage becomes higher.

Figures 3A, 3B, 3C:
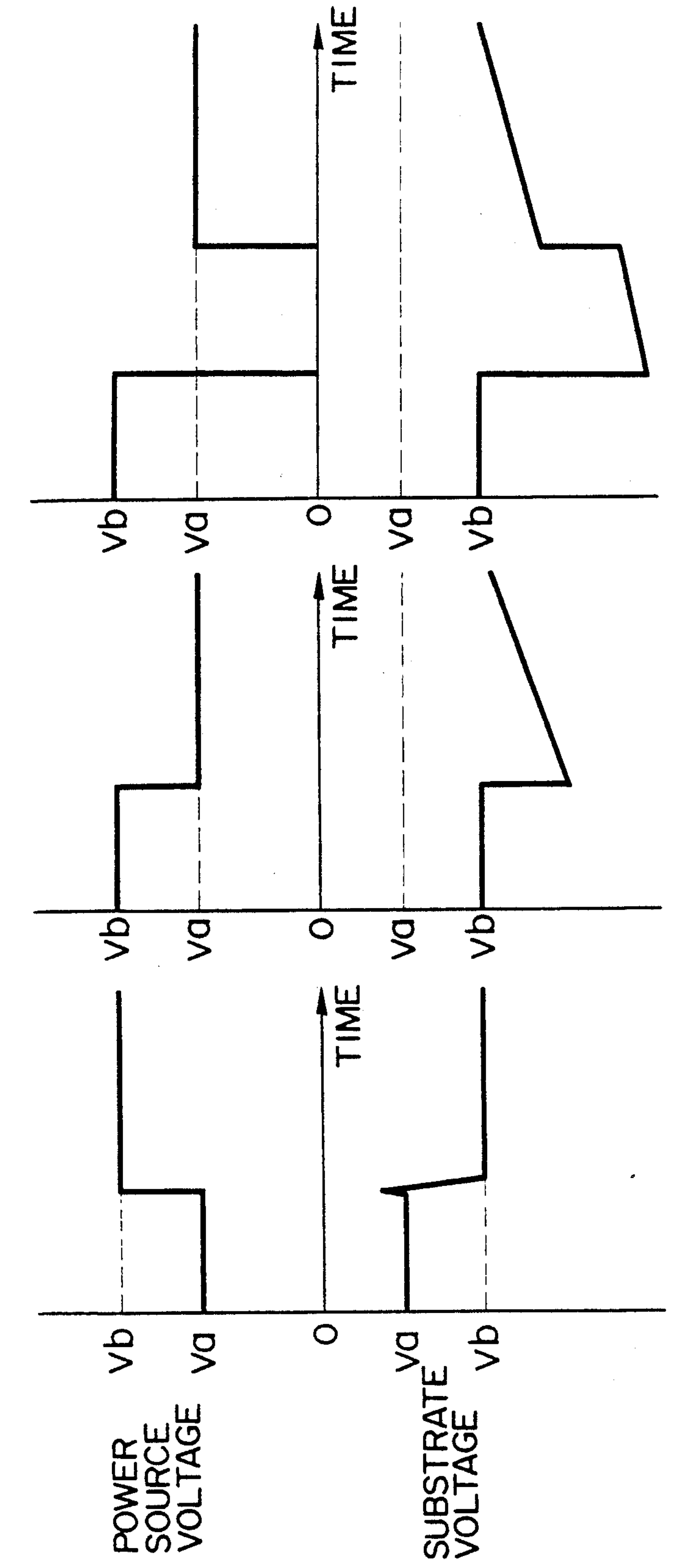
FIGS. 3A to 3C are waveform diagrams showing variation in the substrate voltage with respect to various variations in the power source voltage.

FIGS. 3A to 3C are diagrams showing the characteristic of the substrate potential to follow the power source voltage when the power source voltage has varied.

FIG. 3A shows variation in the substrate potential when the power source voltage rises from Va to Vb. In this case, since the substrate potential detection circuit 63 detects that the substrate potential is not sufficiently deep, the substrate potential generating circuit 62 is set operative and the substrate potential reaches the preset level determined by the substrate potential detection circuit 63 at a relatively high speed. After this, the substrate potential is kept at a constant level, and no particular problem will occur.

In contrast, when the power source voltage is lowered from Vb to Va as shown in FIG. 3B, the substrate potential is lowered in synchronism with the power source voltage because of coupling with the node inside the chip. After this, the substrate potential rises, but no substantial component for pulling up the substrate potential in a positive direction exists inside the chip. That is, only a small amount of current such as junction leak current and leak current in the substrate potential detection circuit 63 may exist as the above component. For this reason, it takes an extremely long time for the substrate potential (corresponding to the power source voltage) to reach a normal level.

At this time, since the substrate potential detection circuit 63 sets the substrate potential generating circuit 62 non-operative since the substrate potential (corresponding to the power source voltage) is deeper than the normal level. Therefore, in the operation immediately after the power source voltage has been lowered, the depletion layer in the PN junction becomes wider since the substrate potential is significantly deeper than in the normal operation. As a result, the threshold voltage of the transistor increases and the operation becomes extremely unstable. As shown in FIG. 3C, the same problem occurs when the power source voltage is once completely turned off and then immediately turned on.

Figure 4A:
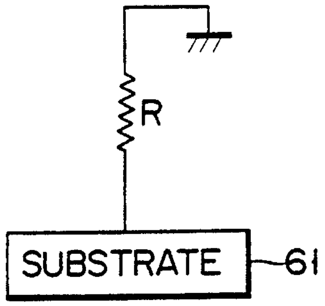
FIGS. 4A and 4B are diagrams of resistor and diode circuits for improving the dependency of the substrate voltage on the power source voltage in the circuit of FIG. 1.
Figure 4B:
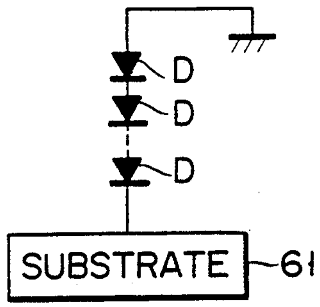

As a countermeasure for the above problem, a method can be considered in which the substrate 61 is connected to a ground node via a high resistance resistor R so as to set the substrate to a ground potential by a leak current as shown in FIG. 4A or the substrate 61 is connected to the ground node via series-connected diodes D so as to set the substrate to a certain voltage by a leak current flowing into the ground node as shown in FIG. 4B.

However, since a current always flows from the ground node to the substrate 61 in the circuit shown in FIG. 4A, current consumption becomes larger. Further, since the resistance of the high resistance resistor R is limited, a large leak current cannot flow in the resistor and it is impossible to set the substrate potential to the ground potential.

Figure 5:
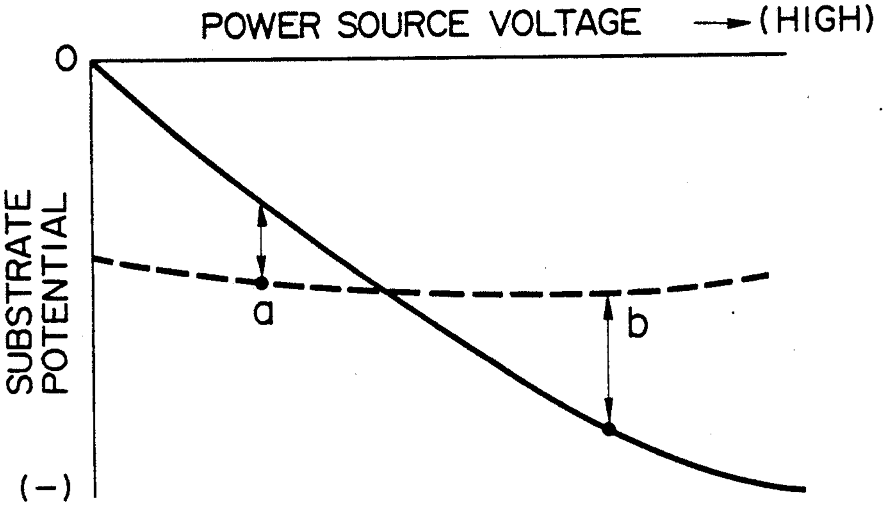
FIG. 5 is a diagram showing the dependency on the power source voltage of FIG. 2 in comparison with the dependency of the substrate voltage on the power source voltage obtained when the circuit of FIG. 4 is connected.

Since the substrate potential is held at a substantially constant level in the circuit of FIG. 4B the dependency characteristic of the circuit becomes different from the dependency of the substrate potential on the power source voltage shown in FIG. 2 as shown by broken lines in FIG. 5. The solid line in FIG. 5 indicates the same dependency of the substrate potential on the power source voltage as shown in FIG. 2. As is clearly seen from the characteristic indicated by the broken lines, the degree of leak of the substrate potential or the degree of variations in the substrate potential towards the ground potential is insufficient in a low power source voltage range as is indicated by a, for example, and the substrate potential is excessively leaked to a shallower level with respect to the detection level of the substrate potential detection circuit 63 in a high power source voltage range as is indicated by b, for example. Therefore, the current consumption increases, and this method is not effective to solve the above problem.

This invention is made to solve a problem that, in a case where the power source voltage drops or the power source voltage is once set to the OFF level and then immediately set to the ON level, the substrate potential is significantly deeper in the circuit operation effected immediately after the power source voltage drop or immediately after the power source voltage is set to the OFF level than in the normal operation and the circuit operation becomes unstable with increase in the threshold voltage of the transistor and may be erroneously effected.

There will now be described an embodiment of this invention with reference to the accompanying drawings.

Figure 6:
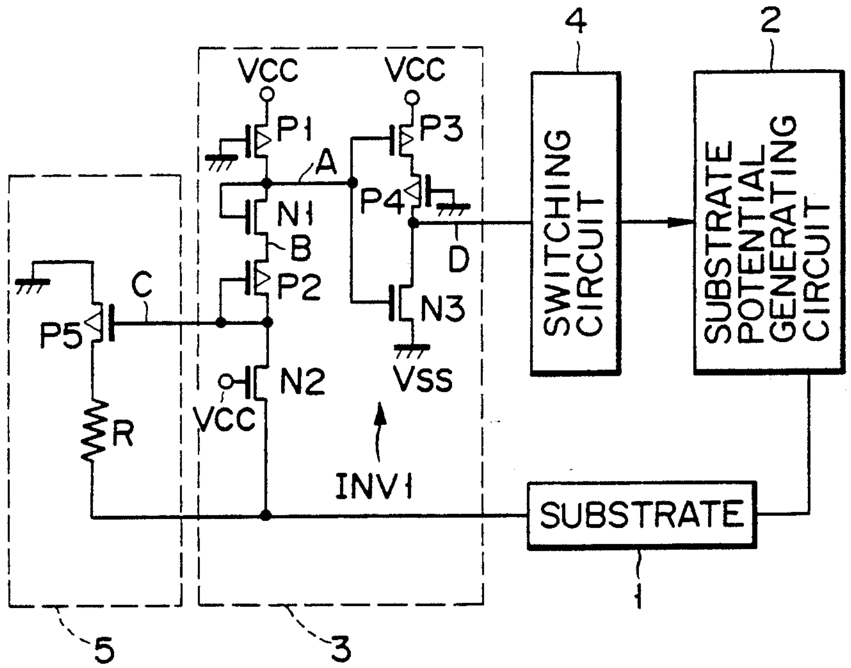
FIG. 6 is a diagram showing the circuit construction of one embodiment of a semiconductor integrated circuit of this invention.

FIG. 6 shows a substrate potential controlling circuit of a semiconductor integrated circuit according to this invention. The substrate potential controlling circuit has a substrate potential controlling function, and includes a substrate potential generating circuit, a substrate potential detection circuit for detecting the substrate potential and a switching circuit for ON-OFF controlling the operation of the substrate potential generating circuit according to the detection output of the substrate potential detection circuit. That is, 1 denotes a substrate, 2 a substrate potential generating circuit for generating a potential of the substrate 1, 3 a substrate potential detection circuit for detecting the potential of the substrate 1, 4 a switching circuit for ON-OFF controlling the operation of the substrate potential generating circuit 2 according to the detection output of the substrate potential detection circuit 3, and 5 a substrate potential leaking circuit. The substrate potential leaking circuit 5 raises the substrate potential by injecting charges into the substrate 1 when the substrate potential becomes lower than a level (detection level) at which the substrate potential generating circuit 2 can operate by more than a preset voltage in a negative direction and interrupts the operation of injecting charges into the substrate 1 when the substrate potential has reached a preset negative voltage level which is slightly lower than the detection level.

The substrate potential detection circuit 3 has several circuit elements which are series-connected between a Vcc power source node and the substrate 1. That is, the detection circuit 3 includes a first P-channel transistor P1 having a gate connected to a ground potential Vss node, a first N-channel transistor N1 having a drain and a gate connected together, a second P-channel transistor P2 having a gate and a drain connected together, and a second N-channel transistor N2 having a gate connected to the Vcc power source node. The detection circuit 3 further includes several circuit elements series-connected between the Vcc node and the Vss node. That is, the detection circuit 3 includes a third P-channel transistor P3, a fourth P-channel transistor P4 having a gate connected to the Vss node, and a third N-channel transistor N3. With the above construction, the drain (point A) of the first N-channel transistor N1 is connected to the respective gates of the third P-channel transistor P3 and the third N-channel transistor N3. The third P-channel transistor P3, fourth P-channel transistor P4 and third N-channel transistor N3 are combined to constitute a first inverter INV1.

The first P-channel transistor P1 and second N-channel transistor N2 effect the ratio operation to control a through current and determine the substrate potentials for respective power source voltages. The second P-channel transistor P2 is used to set the potential of the source (point B) thereof to 0 V or to a level which is lower than 0 V by a small voltage (ΔV1 which is, for example, 0.1 to 0.2 V) when the potential of the gate (point C) of the fifth P-channel transistor P5 has reached a gate potential $V_{thp5}$ (−0.6 V, for example). The threshold voltage $V_{thp2}$ (negative value) thereof is set to satisfy the following expression:

$$|V_{thp5}| - |V_{thp2}| \simeq \Delta V_1 \geqq 0\ V \quad (1)$$

The first N-channel transistor N1 is used to set the potential of the point B to 0 V or to a level which is higher than 0 V by a small voltage (ΔV2 which is, for example, 0.1 to 0.2 V) when the potential of the drain (point A) thereof is set at the threshold voltage $V_{th1}$ of the first inverter INV1. The threshold voltage $V_{thn1}$ (positive value) is set to satisfy the following expression:

$$V_{th1} - V_{thn1} \simeq \Delta V_2 \geqq 0\ V \quad (2)$$

In the semiconductor integrated circuit of this invention, the size of the first N-channel transistor N1 and second P-channel transistor P2 is set larger than that of the first P-channel transistor P1 and second N-channel transistor N2. Therefore, the potential difference between the points A and B is always set to $V_{thn1}$ and the potential difference between the points A and C is always set near $|V_{thp2}|$. Further, the ratio of the size of the third N-channel transistor N3 used as a driving transistor to the total size of the third P-channel transistor P3 and fourth P-channel transistor P4 used as load transistors is set to a large value. With this construction, when the potential of the point A which is an input of the third P-channel transistor P3 and third N-channel transistor N3 has slightly exceeded the threshold voltage $V_{thn3}$ of the third N-channel transistor N3, the potential of an output point (drain of the third N-channel transistor N3) D is immediately set to a low level.

The switching circuit 4 is constructed to set the substrate potential generating circuit 2 operative when the detection output of the output point D of the substrate potential detection circuit 3 is set at a low level, and set the substrate potential generating circuit 2 non-operative when the detection output of the substrate potential detection circuit 3 is set at a high level.

The substrate potential leak circuit 5 has the fifth P-channel transistor P5 and resistor R serially connected between the Vss node and the substrate. The gate (point C) of the fifth P-channel transistor P5 is connected to the gate and drain of the second P-channel transistor P2 of the substrate potential detection circuit 3. The fifth P-channel transistor P5 is a gate transistor for leaking the substrate potential and is turned on to complete a leak path to the substrate 1 when the substrate potential becomes deeper and lower than the threshold voltage $V_{thp5}$ (negative value) of the fifth P-channel transistor P5. At this time, the following equation can be obtained based on Eqs. (1) and (2):

$$-|V_{thp5}| + |V_{thp2}| + V_{thn1} = V_{th1} - (\Delta V_1 + \Delta V_2) \quad (3)$$

Therefore, the output point D of the substrate potential detection circuit 3 is set to a high potential level and the substrate potential generating circuit 3 is already set non-operative.

The resistor R suppresses the charges from being excessively injected into the substrate 1, but can be omitted if the fifth P-channel transistor P5 can be used to limit the current. When the charges are injected into the substrate 1 by means of the fifth P-channel transistor P5, the substrate potential starts to rise. Then, when the potential of the gate (point C) of the fifth P-channel transistor P5 has reached the threshold voltage $V_{thp5}$ of the fifth P-channel transistor P5, the fifth P-channel transistor P5 is turned off, cutting off the rapid leak path to the substrate 1. After this, the substrate 1 is set into the electrically floating condition and the substrate potential is gradually raised by junction leak or the like, and when the potential of the gate (point C) of the fifth P-channel transistor P5 is set to "$-|Vthp_5|+\Delta V_1+\Delta V_2$", or when the potential of the drain (point A) of the first N-channel transistor N1 is set to the threshold voltage $Vth_1$ (positive value) of the inverter INV1, the output point D of the substrate potential detection circuit 3 is set to a low level and the operation of the substrate potential generating circuit 2 is started.

As a result, the voltage "$\Delta V_1+\Delta V_2$" is set in a voltage range in which the substrate is set in the electrically floating condition and which is a stable range for the substrate potential to prevent increase in the current consumption. Further, the value can be freely changed by controlling the threshold voltage of the transistor according to the circuit operation margin for the substrate voltage.

Figure 9:
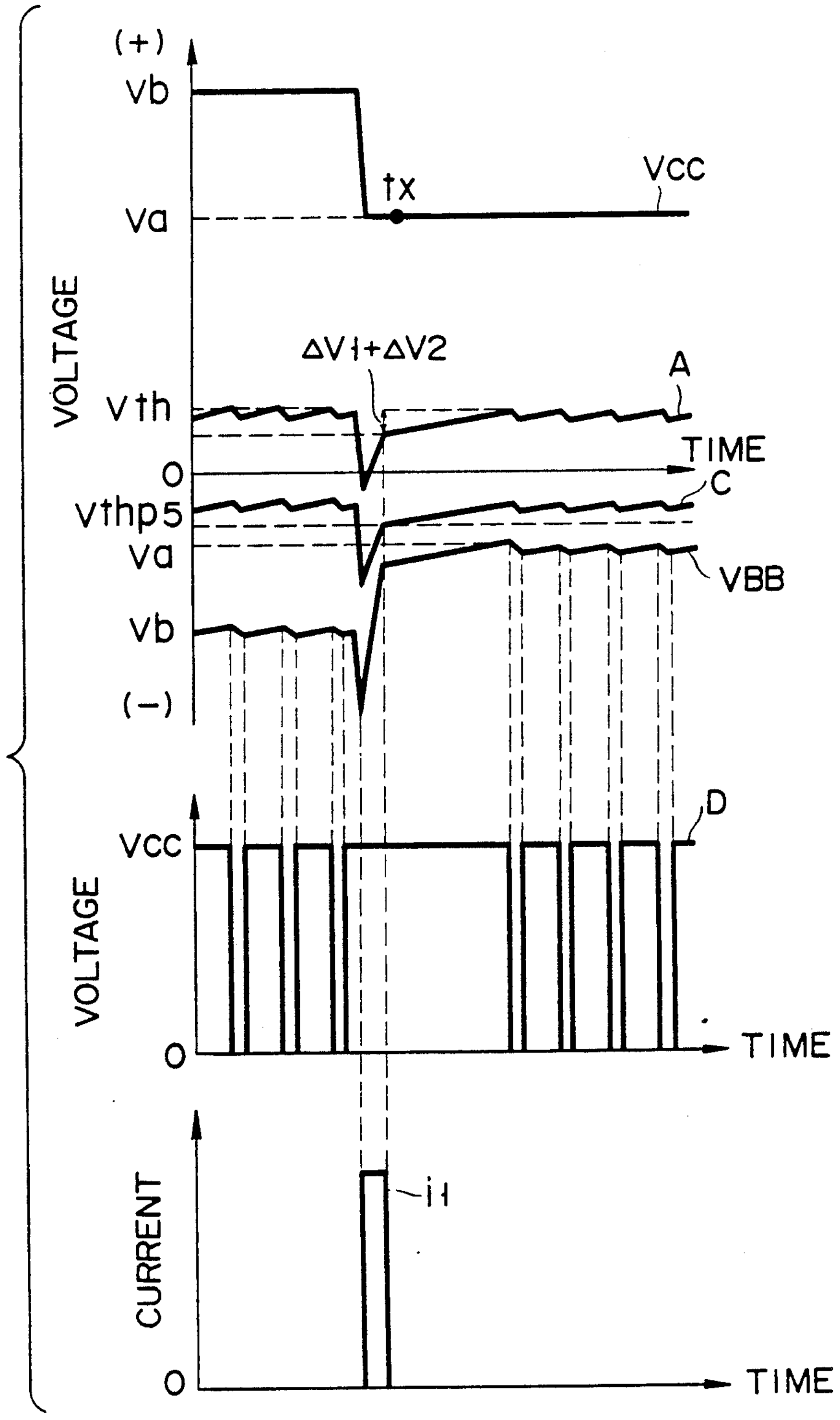
FIG. 9 is a waveform diagram for illustrating the dependency of the substrate potential on the power source voltage drop with reference to the voltage and current waveforms on respective nodes in the circuit of FIG. 6.

FIG. 9 shows the dependency of the substrate potential on the power source voltage and voltage and current waveforms of respective nodes in the circuit of FIG. 6 when the power source voltage drop as shown in FIG. 3B has occurred.

Figure 7:
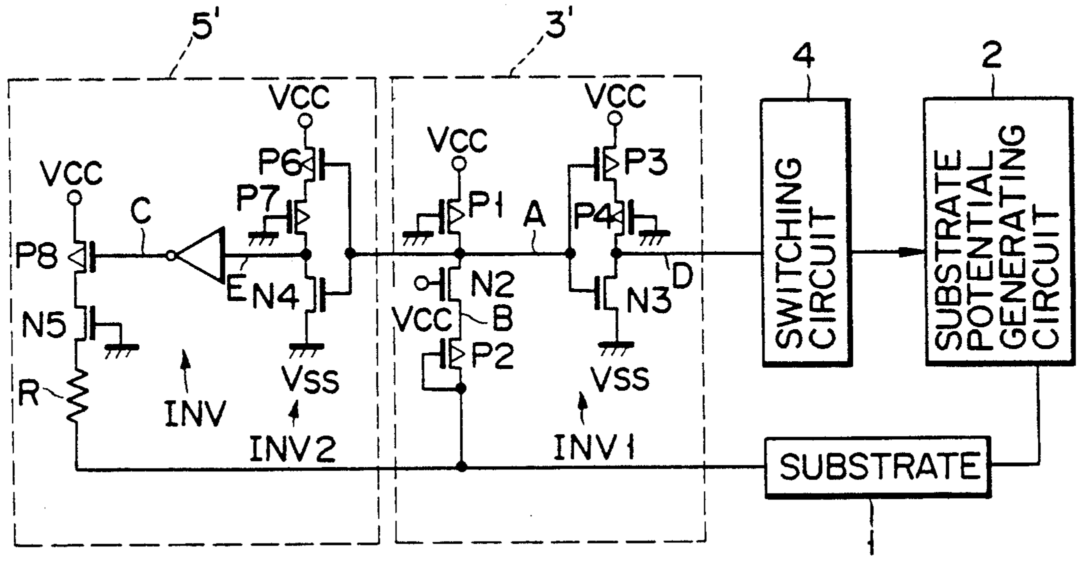
FIG. 7 is a diagram showing the circuit construction of another embodiment of a semiconductor integrated circuit of this invention.

FIG. 7 shows another embodiment which is similar to the former embodiment except a substrate potential detection circuit 3' and a substrate potential leak circuit 5'. The substrate potential detection circuit 3' is similar to the substrate potential detection circuit 3 except that the first N-channel transistor N1 is omitted and the second P-channel transistor P2 is positioned on the source side of the second N-channel transistor N2. However, the operation of the substrate potential detection circuit 3' is substantially the same as that of the substrate potential detection circuit 3.

In the substrate potential leak circuit 5', a sixth P-channel transistor P6, a seventh P-channel transistor P7 whose gate is connected to a Vss node and a fourth N-channel transistor N4 are series-connected between the Vcc node and Vss node, and the drain (point A) of the second N-channel transistor N2 is connected to the gates of the sixth P-channel transistor P6 and fourth N-channel transistor N4. The sixth P-channel transistor P6, seventh P-channel transistor P7 and fourth N-channel transistor N4 are combined to constitute a second inverter INV2.

An eighth P-channel transistor P8 used as a gate transistor, a fifth N-channel transistor N5 whose gate is connected to the Vss node and a resistor R are series-connected between the Vcc node and substrate 1, and these elements are combined to constitute a substrate potential leak path section. The input terminal of a third inverter INV3 is connected to the drain (point E) of the fourth N-channel transistor N4 and the output terminal (point C) of the inverter INV3 is connected to the gate of the eighth P-channel transistor P8.

In the substrate potential leak circuit 5', the threshold voltage $Vth_2$ of the second inverter INV2 is set to be slightly lower than the threshold voltage $Vth_1$ of the first inverter INV1 of the substrate potential detection circuit 3'. The difference between the threshold voltages of the inverters INV1 and INV2 defines a voltage range in which the substrate 1 is substantially kept in the electrically floating condition from when the eighth P-channel transistor P8 of the substrate potential leak path section is cut off until the operation of the substrate potential generating circuit is started. When the substrate potential becomes deeper and the potential of the point A becomes lower than the threshold voltage $Vth_2$ of the second inverter INV2, the potential of the point E rises and the output potential of the third inverter INV3 is lowered.

Assuming that the absolute value of the threshold voltage $Vthp_8$ (negative value) of the eighth P-channel transistor P8 is expressed by $|Vthp_8|$, then the eighth P-channel transistor P8 is turned on to create a leak path to the substrate 1 when the output potential of the third inverter INV3 becomes lower than "$Vcc-|Vthp_8|$". At this time, the fifth N-channel transistor N5 acts as a limiter for holding the substrate potential at least to "$Vss-Vthn_5$" when the threshold voltage (positive value) of the fifth N-channel transistor N5 is expressed by "$Vthn_5$". Further, at this time, the resistor R which functions to suppress the charges from being excessively injected into the substrate 1 can be omitted if a current limiting function can be attained by the eighth P-channel transistor P8 and the fifth N-channel transistor N5. In this case, the output point D of the substrate potential detection circuit 3' is set at a high level and the substrate potential generating circuit 2 is already set non-operative.

When the substrate potential is set to a shallow level by the above leak, the potential of the point A rises and first exceeds the threshold voltage $Vth_2$ of the second inverter INV2. As a result, the second inverter INV2 effects the inverting operation to lower the potential of the point E and the output potential of the third inverter INV3 rises. When the output potential of the third inverter INV3 has reached "$Vcc-|Vthp_8|$", the eighth P-channel transistor P8 is turned off, thereby cutting off the rapid leak path to the substrate 1. At this time, since the potential of the point A has not exceeded the threshold voltage $Vth_1$ of the first inverter INV1, the substrate potential generating circuit 2 is still kept non-operative. After this, the substrate 1 is set into the electrically floating condition, the substrate potential is gradually raised by junction leak or the like, the potential of the point A exceeds the threshold voltage $Vth_1$ of the first inverter INV1, and the substrate potential generating circuit 2 is operated to set or pull back the substrate potential to the preset level.

Figure 10:
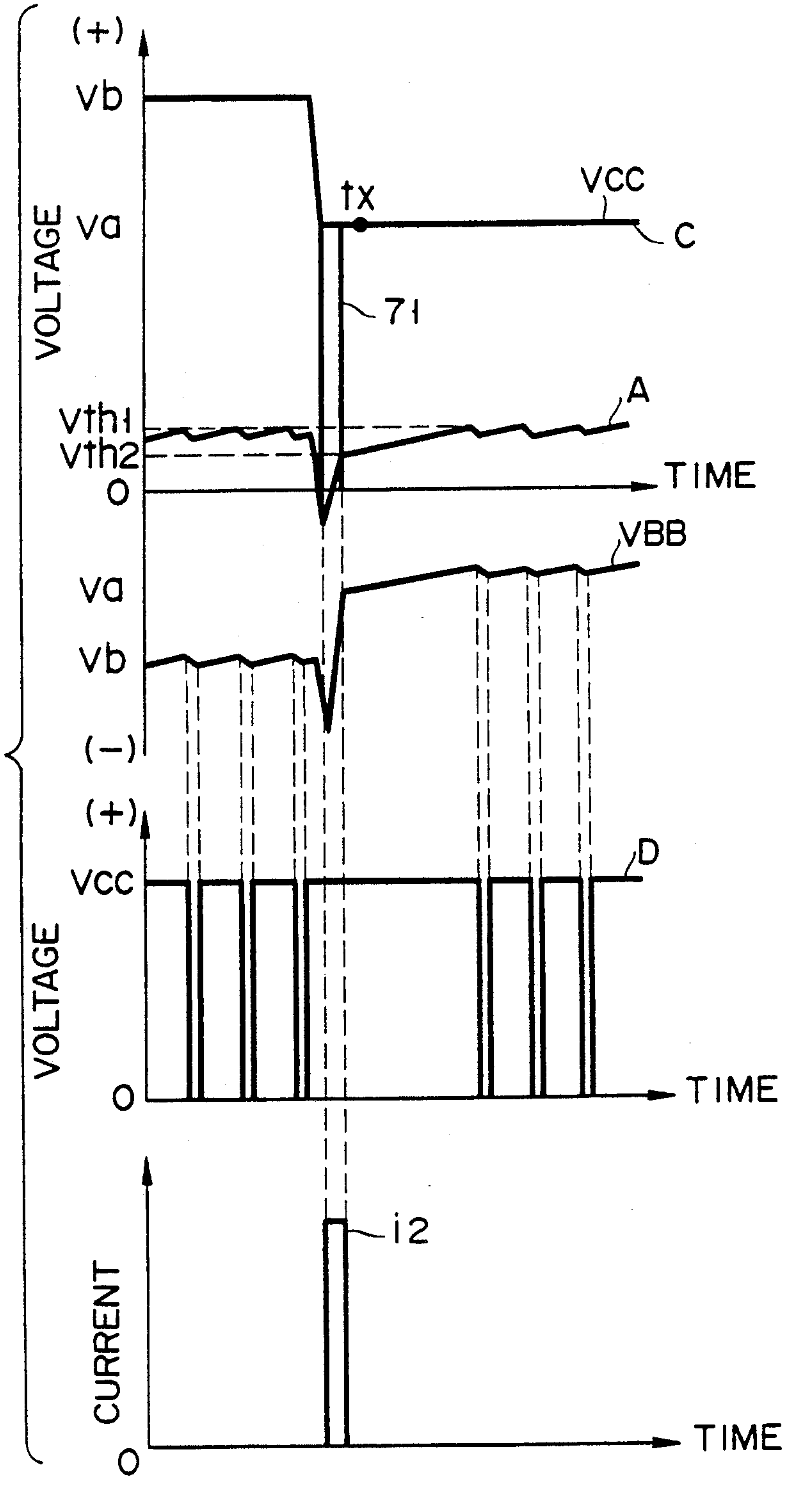
FIG. 10 is a waveform diagram for illustrating the dependency of the substrate potential on the power source voltage drop with reference to the voltage and current waveforms on the respective nodes in the circuits of FIGS. 7*a* and 8.

FIG. 10 shows the dependency of the substrate potential on the power source voltage and voltage and current waveforms of respective nodes in the circuit of FIG. 7 when the power source voltage drop as shown in FIG. 3B has occurred.

Figure 11:
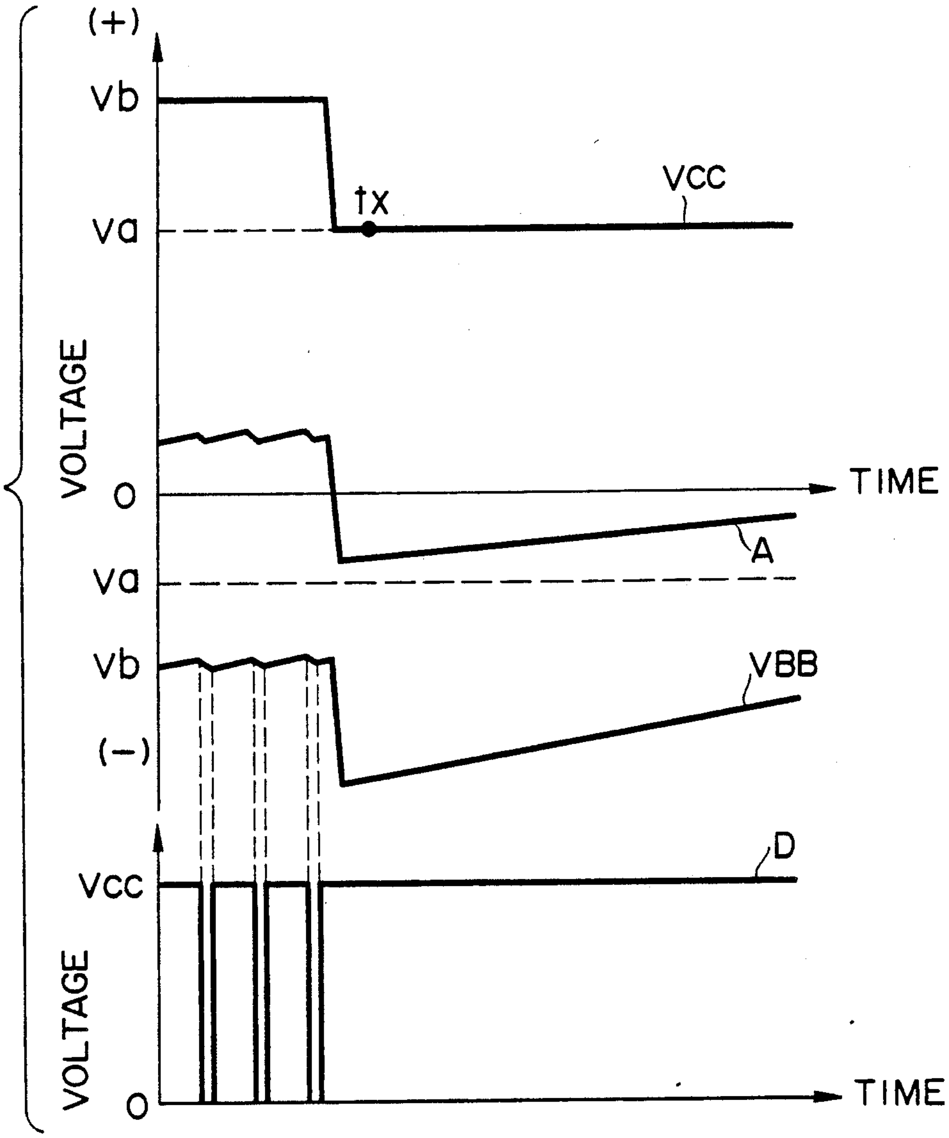
FIG. 11 is a waveform diagram for illustrating the dependency of the substrate potential on the power source voltage drop with reference to the voltage and current waveforms on the respective nodes in the conventional substrate voltage controlling circuit.

FIG. 11 shows the dependency of the substrate potential on the power source voltage and voltage and current waveforms of respective nodes in the conventional circuit (corresponding to a circuit obtained by removing the substrate potential leak circuit 5' from the circuit of FIG. 7) when the power source voltage drop as shown in FIG. 3B has occurred.

In a case where the power source voltage is generally kept constant, the substrate power source $V_{BB}$ is repeatedly subjected to the pull-back effect by the substrate potential generating circuit 2 and leak. Since it takes a certain period of time to effect the operation of the substrate potential generating circuit 2 and switching circuit 4, the substrate potential takes the sawtooth waveform. However, the voltage range of the sawtooth waveform is small and does not vary so much as to operate the substrate potential leak circuit 5 or 5', thereby keeping the current consumption small.

Further, in order to ensure that the substrate potential leak circuit 5' can be kept in the non-operative condition while the substrate potential generating circuit 2 is operated, it is possible to feed back the output of the switching circuit 4 to the leak circuit 5' so as to logically set the leak circuit 5' non-operative while the substrate potential generating circuit 2 is operated.

Figure 8:
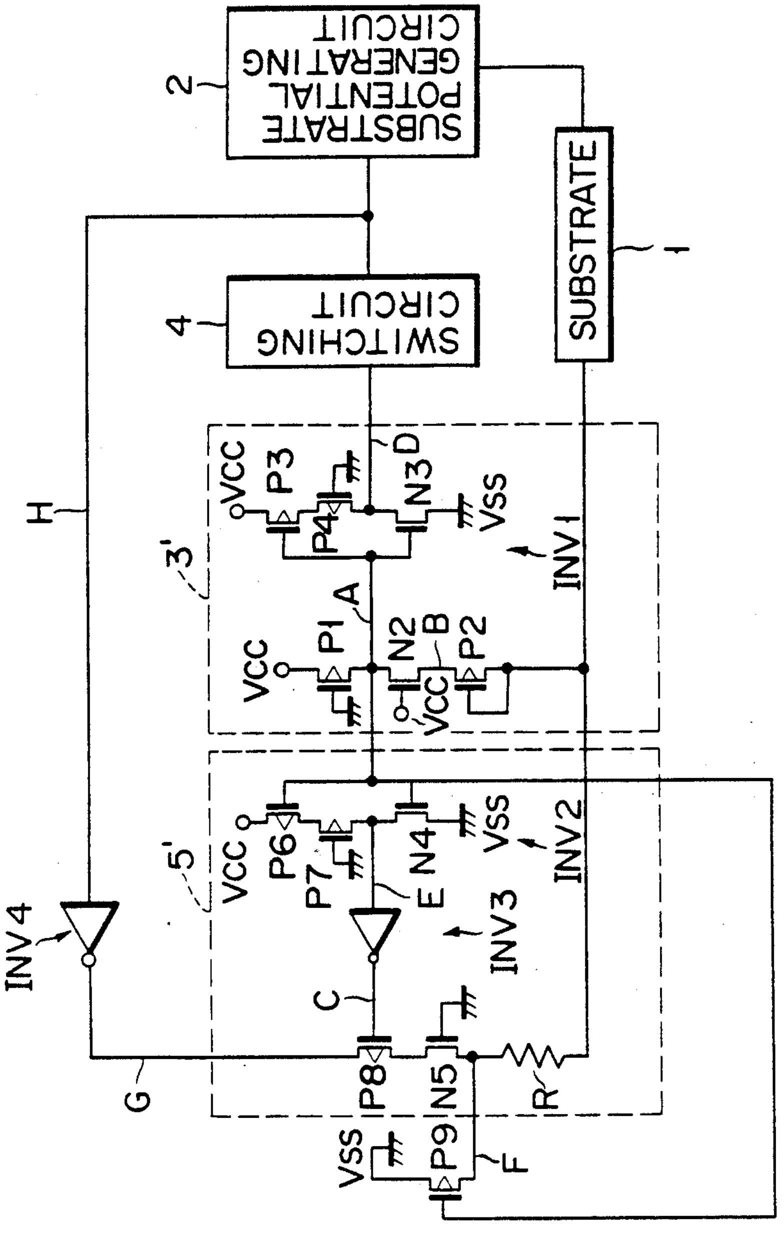
FIG. 8 is a diagram showing the circuit construction of still another embodiment of a semiconductor integrated circuit of this invention.

One example is shown in FIG. 8 using an inverter INV4, and the inverter INV4 receives the potential of the output node (point H) of the switching circuit 4 in a case where the substrate potential generating circuit 2 is operated when the output of the switching circuit 4 is held at an "H" level and the output node (point G) of the inverter INV4 is connected to the source of the eighth P-channel transistor P8 as a leak source instead of the Vcc node of the leak circuit 5'. In this circuit, the output of the switching circuit 4 is kept at the "H" level and the potential of the output node (point G) of the inverter INV4 is set to an "L" level while the substrate potential generating circuit 2 is operated. In this case, even if the potential of the point C is set to the "L" level, the leak circuit 5' will not be set into the operative condition. The feedback circuit may be any type of circuit if it sets the potential of the point G to the "L" level while the substrate potential generating circuit 2 is operated.

As can be understood by comparing FIGS. 9 to 11 with one another, a leak current starts to abruptly flow in response to the power source voltage drop when the potential of point C becomes lower than the threshold voltage $Vthp_5$ (negative value) of the fifth P-channel transistor P5 in a case shown in FIG. 9 and when the potential of point A exceeds the threshold voltage $Vth_2$ of the second inverter INV2 in FIG. 10, thus rapidly restoring the substrate potential. In contrast, in a case shown in FIG. 11, it takes a long time to restore the substrate potential. In this case, $i_1$ denotes a current flowing in the substrate potential leak circuit 5 and $i_2$ denotes a current flowing in the substrate potential leak circuit 5'.

It will be easily understood by considering the operation at the time tx immediately after the power source voltage drop that the circuit of this invention has a remarkably improved effect in comparison with the conventional circuit. The improved effect can also be obtained when the power source voltage is once set to the OFF level and is then raised immediately after this as shown in FIG. 3. In the case of the circuit shown in FIG. 6, the substrate potential leaks to a level near the threshold voltage $Vthp_5$ (negative value) of the fifth P-channel transistor P5 while the power source voltage is set at the OFF level. On the other hand, in the case of the circuits shown in FIGS. 7 and 8, the substrate potential does not leak while the power source voltage is set at the OFF level, and it is restored to a substrate potential level corresponding to the power source voltage immediately after the power source voltage is set to the ON level again.

In the circuit of FIG. 7, in order to attain the same dependency of the substrate potential $V_{BB}$ on the Vcc potential OFF-time as that in the circuit of FIG. 6, a ninth P-channel transistor P9 whose source, gate and drain are respectively connected to the Vss node, point A and the source (point A) of the fifth N-channel transistor N5 may be additionally used as shown in FIG. 8. In this case, however, the level to which the substrate potential $V_{BB}$ is pulled back during the Vcc potential OFF-time may be set near "$Vthp_2+Vthp_9$". $Vthp_2$ is the threshold voltage of the second P-channel transistor P2 and $Vthp_9$ is the threshold voltage of the ninth P-channel transistor P9.

Further, when the power source voltage has risen as shown in FIG. 3A, the substrate potential detection circuit 3 is made operative in the same manner as in the conventional case so that the substrate potential generating circuit 3 can be operated to lower the substrate potential to a level corresponding to the power source voltage and therefore there occurs no special problem.

Figure 12:
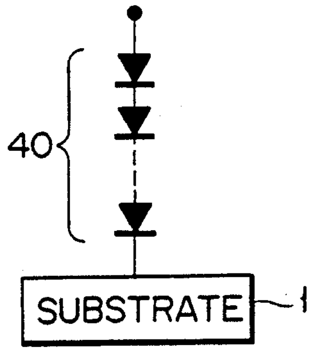
FIG. 12 is a diagram of a diode circuit which may be connected to the circuit of this invention so as to change the dependency of the substrate potential on the power source voltage.
Figure 13:
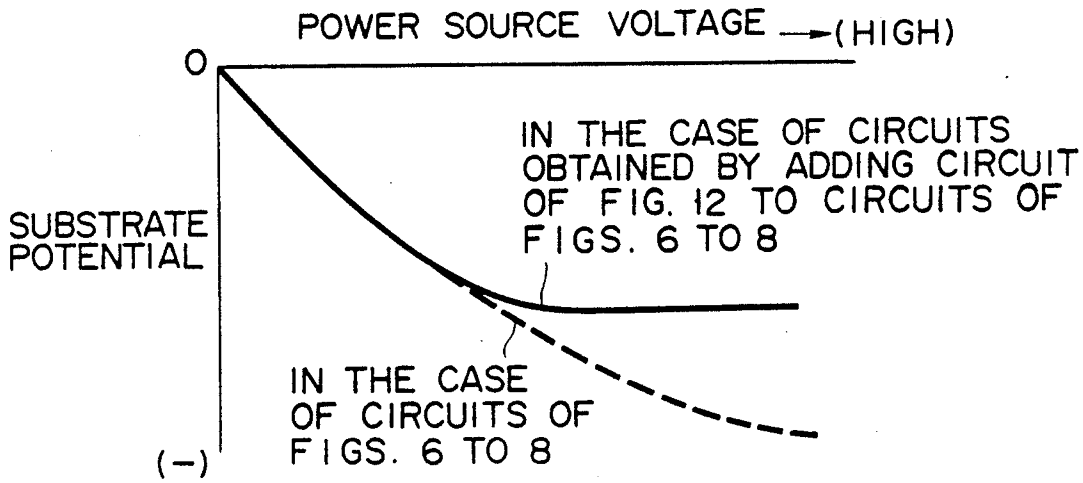
FIG. 13 is a diagram showing the dependency of the substrate potential on the power source voltage in the circuit of this invention shown in FIGS. 6 to 8 in comparison with the dependency of the substrate potential on the power source voltage obtained when the circuit of FIG. 12 is connected.

It is possible to change the dependency of the substrate potential on the power source voltage as indicated by the solid line in FIG. 13 by connecting one end of the diode circuit 40 or the like shown in FIG. 12 to the point B of the substrate potential detection circuit 3 or to the point A of the substrate potential detection circuit 3' of FIG. 7 or 8. In this case, it is possible to attain the same effect as described in each of the former embodiments.

As described above, according to the substrate potential controlling circuit of the semiconductor integrated circuit of this invention, the substrate potential detection circuit is commonly used to set the substrate potential generating circuit into the operative condition when the substrate potential becomes higher than a preset level and set the substrate potential leak circuit into the operative condition when the substrate potential becomes lower than a preset level so that the ability of the substrate potential to follow variations in the power source voltage can be enhanced without increasing the current consumption. Further, the substrate potential detection circuit is commonly used, the substrate potential set after the pull-back operation can be precisely determined without receiving influence by variation of the properties of elements.

Additional advantages and modifications will readily occur to those skilled in the art. Therefore, the invention in its broader aspects is not limited to the specific details, representative devices, shown and described herein. Accordingly, various modifications may be made without departing from the spirit or scope of the general inventive concept as defined by the appended claims and their equivalents.

What is claimed is:

1. A semiconductor integrated circuit comprising:

means for generating a substrate potential, connected to a substrate and set operative on at least a certain operation voltage level;

detection means including a first detection means for outputting a first detection signal upon detecting that the substrate potential generated by said substrate potential generating means has become lower than the operation voltage level by more than a preset amount, and including a second detection means for outputting a second detection signal upon detecting that the substrate potential has reached a preset level which is set slightly lower than the operation voltage level, said first and second detection means each including a common reference circuit; and means connected to said detection means, for charging the substrate upon receiving the first detection signal, and interrupting the charging operation upon receiving the second detection signal.

2. A semiconductor integrated circuit according to claim 1, wherein said detection means includes a first p-channel transistor having a gate connected to a ground potential node, a first n-channel transistor having a gate and a drain connected together, a second p-channel transistor having a gate and a drain connected together, and a second n-channel transistor having a gate connected to a power source node, said first p-channel transistor, said first n-channel transistor, said second p-channel transistor and said second n-channel transistor being series-connected between said power source node and said substrate, and further includes a third p-channel transistor having a gate connected to the drain of said first p-channel transistor and a source connected to said power source node, a fourth p-channel transistor having a gate connected to a ground potential node, and a third n-channel transistor having a gate connected to the drain of said first p-channel transistor and a source connected to said ground potential node, said third n-channel transistor, said third p-channel transistor and said fourth p-channel transistor being series-connected between said power source node and said ground potential node.

3. A semiconductor integrated circuit according to claim 2, wherein the size of said first n-channel transistor and said second p-channel transistor is set to be larger than that of said first p-channel transistor and said second n-channel transistor.

4. A semiconductor integrated circuit according to claim 2, wherein said charging means includes means for limiting the degree of charging the substrate.

5. A semiconductor integrated circuit according to claim 4, wherein said charging means includes a fifth p-channel transistor connected in series with said limiting means between said ground potential node and said substrate, to leak the substrate potential.

6. A semiconductor integrated circuit according to claim 1, wherein said charging means includes a first p-channel transistor, a second p-channel transistor having a gate connected to a ground potential node, and a first n-channel transistor, said first p-channel transistor, said second p-channel transistor, and said first n-channel transistor being series-connected between a power source node and said ground potential node, and further includes a third p-channel transistor acting as a gate transistor, and a second n-channel transistor having a gate connected to said power source node, said third p-channel transistor and said second n-channel transistor being series-connected between said power source node and said substrate, and the drain of said first n-channel transistor being connected to an input terminal of an inverter, and the gate of said third p-channel transistor being connected to an output terminal of said inverter.

7. A semiconductor integrated circuit according to claim 1, wherein said detection means includes a first p-channel transistor having a gate connected to a ground potential node, a second p-channel transistor having a gate and a drain connected together, and a first n-channel transistor having a gate connected to a power source node, said transistor first p-channel transistor, said second p-channel transistor, and said first n-channel transistor being series-connected between said power source node and said substrate, and further includes a third p-channel transistor having a gate connected to the drain of said first p-channel transistor and a source connected to said power source node, a fourth p-channel transistor having a gate connected to said ground potential node, and a second n-channel transistor having a gate connected to the drain of said first p-channel transistor and a source connected to said ground potential node, said third p-channel transistor, said second n-channel transistor and said fourth p-channel transistor transistors being series-connected between said power source node and said ground potential node.

8. A semiconductor integrated circuit according to claim 2, further comprising a diode connected to the source of said first n-channel transistor.

9. A semiconductor integrated circuit according to claim 1, further comprising means connected to said substrate potential generating means and said charging means, for interrupting the charging operation by said charging means while said substrate potential generating means is operating.

10. A semiconductor integrated circuit according to claim 9, wherein said interrupting means includes an inverter circuit.

11. A semiconductor integrated circuit according to claim 6, further comprising a fourth p-channel transistor having a drain connected to the source of said second n-channel transistor.

12. A semiconductor integrated circuit according to claim 7, further comprising a diode connected to the drain of said first p-channel transistor.

13. A semiconductor integrated circuit comprising:

means for generating a substrate potential, connected to a substrate and set operative on at least a certain operation voltage level;

detection means including a first detection means for outputting a first detection signal upon detecting that the substrate potential generated by said substrate potential generating means has reached a first detection level that is lower than the operation voltage by more than a preset amount, and including a second detection means for outputting a second detection signal upon detecting that the substrate potential has reached a second detection level which is set slightly lower than the operation voltage level, said first and second detection means each including a common reference circuit; and means, connected to said detection means, for charging the substrate upon receiving the first detection signal, and interrupting the charging operation upon receiving the second detection signal, wherein the difference between the first detection level and second detection level is generated using the difference among the threshold voltages of a plurality of transistor elements.

14. A semiconductor integrated circuit according to claim 13, wherein said detection means includes a first p-channel transistor having a gate connected to a ground potential node, a first n-channel transistor having a gate and a drain connected together, a second p-channel transistor having a gate and a drain connected together, and a second n-channel transistor having a gate connected to a power source node, said first p-channel transistor, said first n-channel transistor, said second p-channel transistor and said second n-channel transistor being series-connected between said power source node and said substrate, and further includes a third p-channel transistor having a gate connected to the drain of said first p-channel transistor and a source connected to said power source node, a fourth p-channel transistor having a gate connected to a ground potential node, and a third n-channel transistor having a gate connected to the drain of said first p-channel transistor and a source connected to said ground potential node, said third n-channel transistor, said third p-channel transistor and said fourth p-channel transistor being series-connected between said power source node and said ground potential node.

15. A semiconductor integrated circuit according to claim 14, wherein the size of said first n-channel transistor and said second p-channel transistor is set to be larger than that of said first p-channel transistor and said second n-channel transistor.

16. A semiconductor integrated circuit according to claim 14, wherein said charging means includes means for limiting the degree of charging the substrate.

17. A semiconductor integrated circuit according to claim 16, wherein said charging means includes a fifth p-channel transistor connected in series with said limiting means between said ground potential node and said substrate, to leak the substrate potential.

18. A semiconductor integrated circuit according to claim 13, wherein said charging means includes a first p-channel transistor, a second p-channel transistor having a gate connected to a ground potential node, and a first n-channel transistor, said first p-channel transistor, said second p-channel transistor, and said first n-channel transistor being series-connected between a power source node and said ground potential node, and further includes a third p-channel transistor acting as a gate transistor, and a second n-channel transistor having a gate connected to said power source node, said third p-channel transistor and said second n-channel transistor being series-connected between said power source node and said substrate, and the drain of said first n-channel transistor being connected to an input terminal of an inverter, and the gate of said third p-channel transistor being connected to an output terminal of said inverter.

19. A semiconductor integrated circuit according to claim 13, wherein said detection means includes a first p-channel transistor having a gate connected to a ground potential node, a second p-channel transistor having a gate and a drain connected together, and a first n-channel transistor having a gate connected to a power source node, said first p-channel transistor, said second p-channel transistor, and said first n-channel transistor being series-connected between said power source node and said substrate, and further includes a third p-channel transistor having a gate connected to the drain of said first p-channel transistor and a source connected to said power source node, a fourth p-channel transistor having a gate connected to said ground potential node, and a second n-channel transistor having a gate connected to the drain of said first p-channel transistor and a source connected to said ground potential node, said third p-channel transistor, said second n-channel transistor and said fourth p-channel transistor being series-connected between said power source node and said ground potential node.

20. A semiconductor integrated circuit according to claim 14, further comprising a diode connected to the source of said first n-channel transistor.

21. A semiconductor integrated circuit according to claim 13, further comprising means connected to said substrate potential generating means and said charging means, for interrupting the charging operation by said charging means while said substrate potential generating means is operating.

22. A semiconductor integrated circuit according to claim 21, wherein said interrupting means includes an inverter circuit.

23. A semiconductor integrated circuit according to claim 18, further comprising a fourth p-channel transistor having a drain connected to the source of said second n-channel transistor.

24. A semiconductor integrated circuit according to claim 19, further comprising a diode connected to the drain of said first p-channel transistor.

* * * * *